US007973611B2

(12) United States Patent
Abbink et al.

(10) Patent No.: US 7,973,611 B2
(45) Date of Patent: Jul. 5, 2011

(54) MIDDLE LAYER OF DIE STRUCTURE THAT COMPRISES A CAVITY THAT HOLDS AN ALKALI METAL

(75) Inventors: Henry C. Abbink, Westlake Village, CA (US); William P. Debley, Northridge, CA (US); Christine E. Geosling, Calabasas, CA (US); Daryl K. Sakaida, Simi Valley, CA (US); Robert E. Stewart, Woodland Hills, CA (US)

(73) Assignee: Northrop Grumman Guidance and Electronics Company, Inc., Woodland Hills, CA (US)

( * ) Notice: Subject to any disclaimer, the term of this patent is extended or adjusted under 35 U.S.C. 154(b) by 0 days.

(21) Appl. No.: 11/900,244

(22) Filed: Sep. 11, 2007

(65) Prior Publication Data

US 2008/0000606 A1 Jan. 3, 2008

(51) Int. Cl.
*H03L 7/26* (2006.01)

(52) U.S. Cl. .......................................... 331/94.1; 331/3

(58) Field of Classification Search .............. 331/3, 94.1
See application file for complete search history.

(56) References Cited

U.S. PATENT DOCUMENTS

| | | | | |
|---|---|---|---|---|
| 3,382,452 | A * | 5/1968 | Rempel et al. | 331/3 |
| 5,528,028 | A * | 6/1996 | Chu et al. | 250/251 |
| 6,297,072 | B1 * | 10/2001 | Tilmans et al. | 438/106 |
| 6,570,459 | B1 * | 5/2003 | Nathanson et al. | 331/94.1 |

* cited by examiner

*Primary Examiner* — Robert Pascal
*Assistant Examiner* — James E Goodley
(74) *Attorney, Agent, or Firm* — Carmen Patti Law Group, LLC

(57) ABSTRACT

An apparatus in one example comprises a die structure that comprises a middle layer, a first outside layer, and a second outside layer. The middle layer comprises a cavity that holds an alkali metal, and one of the first outside layer and the second outside layer comprises a channel that leads to the cavity. The middle layer, the first outside layer, and the second outside layer comprise dies from one or more wafer substrates.

10 Claims, 3 Drawing Sheets

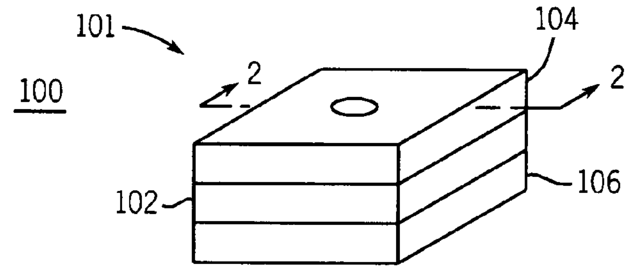
FIG. 1
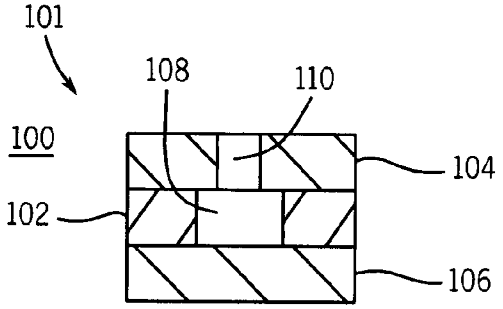
FIG. 2
FIG. 3
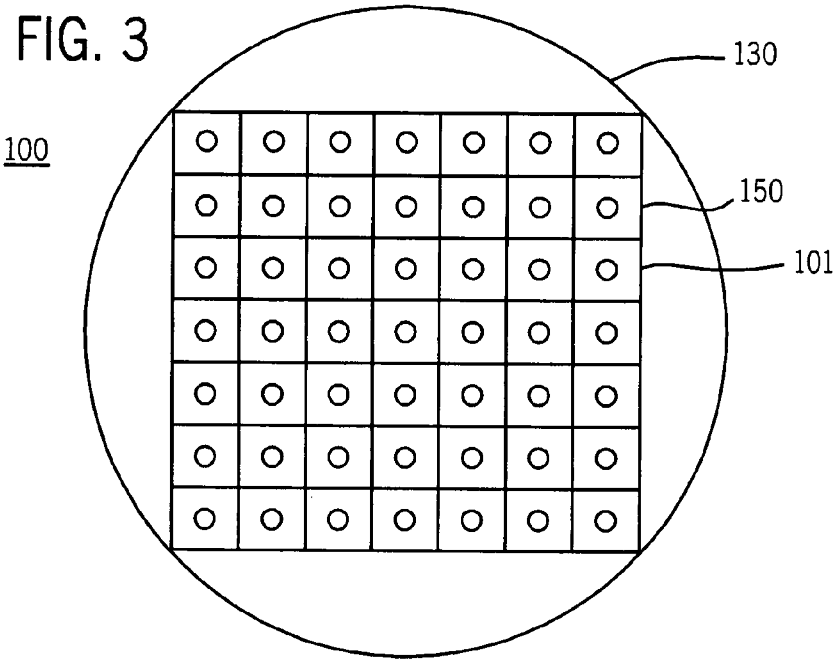

MIDDLE LAYER OF DIE STRUCTURE THAT COMPRISES A CAVITY THAT HOLDS AN ALKALI METAL

BACKGROUND

Alkali metals (i.e., cesium) are used by various systems and devices. In order to integrate cesium with elements of a system it may be necessary to encapsulate the cesium in a closed structure. A small system or device may require the closed structure encapsulating cesium to be small. To maintain the integrity of the cesium cell, the inner surfaces of the closed structure are constructed with a material that does not react to cesium or is passive with respect to cesium.

In one example, the closed structure encapsulating cesium comprises an ampoule of a borosilicate glass (i.e., Pyrex). Pyrex does not react to cesium. Glass blowing technology is often used to generate the ampoule. A plurality of ampoules may be attached to a manifold and therefore the plurality of ampoules may be filled with cesium simultaneously. To fill the ampoule or plurality of ampoules the ampoule or manifold connecting the plurality of ampoules is infused with cesium. For example, differential heating moves droplets of cesium through a glass tube into an opening in the ampoule. Once the ampoule is filled with cesium, then the opening of the ampoule is pinched or fused to seal the cesium within the ampoule.

As one shortcoming, the process of encapsulating cesium within the plurality of ampoules is not automated. Therefore, the process is not well suited for batch fabrication. As another shortcoming, using glass blowing technology to create a small closed structure encapsulating cesium and controlling the dimensions of the small closed structure encapsulating cesium is difficult. The lack of control over the dimensions of the small closed structure encapsulating cesium limits an endurance of the small closed structure encapsulating cesium to effects of shock and vibration. Therefore, the fabrication of the small closed structure encapsulating cesium is dependent on a highly skilled glass blowing technique. As yet another shortcoming, a large closed structure encapsulating cesium requires more power to maintain a temperature the large closed structure encapsulating cesium within a range than the small closed structure encapsulating cesium in environments where the ambient temperature is outside of the range. As yet another shortcoming, the small system or device may not be able to use the large closed structure encapsulating cesium. As yet another shortcoming, the closed structure encapsulating cesium created though glass blowing technology is restricted in functionality to the encapsulation of cesium, and not amenable to function as part of a system or device beyond such functionality.

Thus, a need exists for an enhanced closed structure encapsulating an alkali metal. A need also exists for an enhanced process of encapsulating an alkali metal within a closed structure.

SUMMARY

The invention in one implementation encompasses an apparatus. The apparatus comprises a die structure that comprises a middle layer, a first outside layer, and a second outside layer. The middle layer comprises a cavity that holds an alkali metal, wherein one of the first outside layer and the second outside layer comprises a channel that leads to the cavity. The middle layer, the first outside layer, and the second outside layer comprise dies from one or more wafer substrates.

Another implementation of the invention encompasses an apparatus. The apparatus comprises a chamber that accommodates an array of die structures that comprises one or more cavities. The chamber comprises an alkali metal source and an alkali metal source control component. The alkali metal source control component fills a portion of the chamber and the one or more cavities of the array of die structures with a portion of the alkali metal source.

Yet another implementation of the invention encompasses an apparatus. The apparatus comprises a first layer of a die structure package that comprises a die structure, a thermal isolator, and an electrical conductor and a second layer of the die structure package that comprises one or more electronic components that provide supplementary functionality to one or more of the die structure, the thermal isolator, and the electrical conductor. The die structure package comprises inorganic materials that serves to promote a reduction of gases released from the die structure package.

Still yet another implementation of the invention encompasses a method. A chamber is selected that accommodates an array of die structures that comprises one or more cavities. An inner chamber of the chamber is maintained at a first temperature. An alkali metal source of the chamber is maintained at a second temperature greater than the first temperature. An outer chamber of the chamber is maintained at a third temperature greater than the first temperature and the second temperature. The one or more cavities of the array of die structures is filled with a portion of the alkali metal source. The one or more cavities of the array of die structures is sealed to comprise the portion of the alkali metal source.

BRIEF DESCRIPTION OF THE DRAWINGS

Features of exemplary implementations of the invention will become apparent from the description, the claims, and the accompanying drawings in which:

FIG. 1 is a representation of one exemplary implementation of an apparatus that comprises a die structure with a reservoir for an alkali metal.

FIG. 2 is a sectional representation of the die structure directed along line 2-2 of FIG. 1.

FIG. 3 is a representation of one exemplary implementation of a wafer structure that comprises an array of die structures analogous to the die structure of the apparatus of FIG. 1.

DETAILED DESCRIPTION

Figure 4:
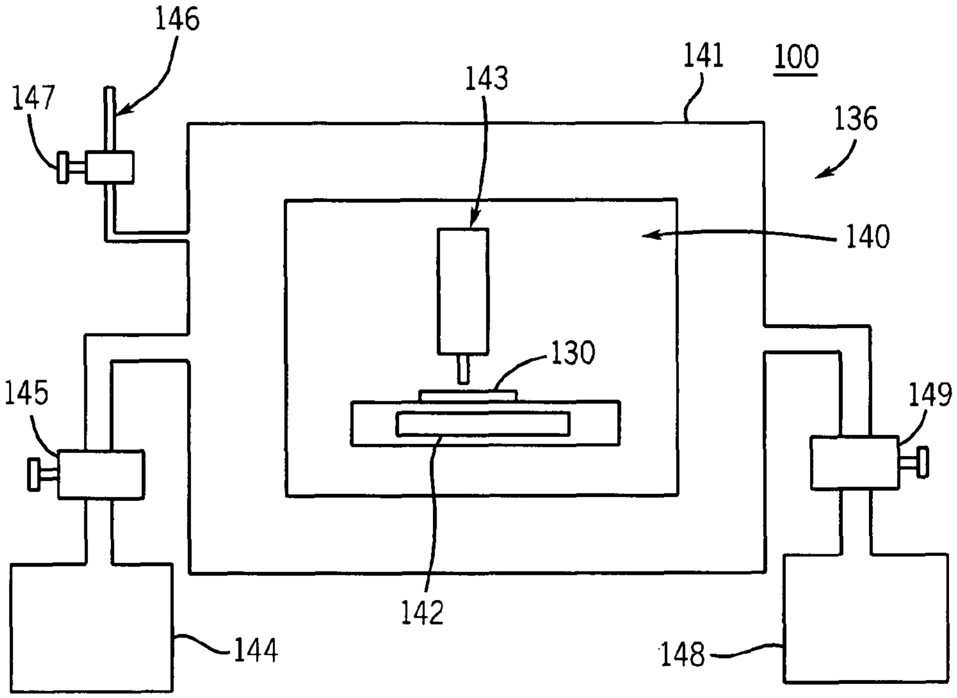
FIG. 4 is a representation of one exemplary implementation of a chamber structure that serves to fill with cesium the die structure of the apparatus of FIG. 1.

Turning to FIG. 1, an apparatus 100 in one example comprises a die structure 101 that has a reservoir for an alkali metal (i.e., cesium). The apparatus 100 includes a plurality of components that can be combined or divided. The die structure 101 comprises a middle layer 102, a first outside layer 104, and a second outside layer 106. The middle layer 102, the first outside layer 104, and the second outside layer 106 comprise dies from a wafer substrate. The middle layer 102, the first outside layer 104, and the second outside layer 106 are attached by a method of wafer bonding (i.e., anodic bonding). In one example, one or more outside surfaces of the middle layer 102 are coated with a metal (i.e., tungsten) for anodic bonding with the first outside layer 104 and the second outside layer 106. Tungsten is inert with respect to cesium. In another example, one or more outside surfaces of the first outside layer 104 and the second outside layer 106 are coated with tungsten for anodic bonding with the middle layer 102. The first outside layer 104 and the second outside layer 106 may comprise one or more windows to facilitate an entrance and an exit of a laser light.

In one example, the die structure 101 comprises a silicon die and two Pyrex dice. For example, the silicon die is formed from a silicon wafer substrate and the two Pyrex dice are formed from one or more Pyrex wafer substrates. In one example, the one or more Pyrex wafer substrates may comprise any borosilicate glass. The middle layer 102 comprises the silicon die. One or more surfaces of the middle layer 102 that may come in contact with cesium are doped with phosphorous and oxidized to protect against a reaction with cesium. For example, the middle layer comprises one or more outer surfaces oxidized by phosphorus doped silicon dioxide. The first outside layer 104 and the second outside layer 106 comprise the two Pyrex dice. Pyrex is inert with respect to cesium and will not react upon contact with cesium, therefore the first outside layer 104 and the second outside layer 106 do not require oxidation to protect against a reaction with cesium.

In another example, the die structure 101 comprises three silicon dice. For example, the three silicon dice are formed from one or more silicon wafer substrates. The middle layer 102, the first outside layer 104, and the second outside layer 106 comprise the three silicon dice. One or more surfaces of the middle layer 102, the first outside layer 104, and the second outside layer 106 that may come in contact with cesium are doped with phosphorous and oxidized to protect against a reaction with cesium.

In yet another example, the die structure 101 comprises three Pyrex dice. For example, the three Pyrex dice are formed from one or more Pyrex wafer substrates. The middle layer 102, the first outside layer 104, and the second outside layer 106 comprise the three Pyrex dice.

Turning to FIG. 2 (a cross section 2-2 of FIG. 1), the middle layer 102 comprises a cavity 108 that serves as at least a portion of the reservoir for the alkali metal. The first outside layer 104 comprises a channel 110 that leads into the cavity 108 from outside the die structure 101. In one example, the channel 110 comprises a minimal size that allows cesium to access the cavity 108. In one example, one or more surfaces of the cavity 108 and the channel 110 comprise a material that does not react to contact with cesium. In another example, the one or more surfaces of the cavity 108 and the channel 110 comprise an outer layer (i.e., a coating) that does not react to contact with cesium. In yet another example, all surfaces of the cavity 108 and the channel 110 that may come in contact with cesium comprise a material or the outer layer that does not react to contact with cesium.

In one example, the die structure 101 comprises a cube with sides equal to two millimeters, and the cavity 108 comprises a cube shaped void within the die structure 101 with sides equal to one millimeter. The die structure 101 with sides equal to two millimeters is useful to applications that require the die structure 101 to be small. The cavity 108 with sides equal to one millimeter is advantageous to applications that require maintenance of a temperature of the cesium in the cavity 108 to be within a range that is above the ambient temperature. The small size of the cavity 108 promotes a reduction of the amount of power used to heat the cesium in the cavity 108.

Turning to FIG. 3, a wafer structure 130 illustrates an array of die structures analogous to the die structure 101. The die structure 101 comprises one of plurality of die structures generated on the wafer structure 130 by micro-electromechanical system ("MEMS") batch fabrication technology. The wafer structure 130 may comprise a single wafer or a plurality of wafers bonded together. The wafer structure 130 serves to illustrate the batch fabrication capability of micro-electromechanical systems technology that creates the wafer structure 130. In one example, the wafer structure 130 comprises the single wafer. The single wafer corresponds to one layer of the middle layer 102, the first outside layer 104, and the second outside layer 106 shown in FIGS. 1 and 2. In another example, the wafer structure 130 comprises three wafers bonded together. The three wafers bonded together correspond to the middle layer 102, the first outside layer 104, and the second outside layer 106 shown in FIGS. 1 and 2.

The wafer structure 130 yields one or more die structures analogous to the die structure 101. How many of the one or more die structures the wafer structure 130 yields is dependent on a size of the die structure 101 and a size of the wafer structure 130. In one example, the wafer structure 130 yields one hundred die structures analogous to the die structure 101. In another example, the wafer structure 130 yields one thousand die structures analogous to the die structure 101. The batch fabrication capability of micro-electromechanical systems technology allows for generation of multiple reservoirs for cesium (i.e., the die structure 101) on the wafer structure 130. Micro-electromechanical systems technology is able to create structures on the wafer structure 130 made of silicon, glass, or other material with feature sizes in the micrometer range. Micro-electromechanical systems technology is able to create the multiple reservoirs for cesium that are substantially smaller than reservoirs for cesium made by previous methods. Micro-electromechanical systems technology allows more controllability than glass blowing to enable creation of the die structure 101 to sustain effects of shock and vibration.

Turning to FIG. 4, a chamber structure 136 that serves to fill with cesium the die structure of the apparatus 100. The chamber structure 136 fills with cesium and seals the array of die structures analogous to the die structure 101. In one example, the chamber structure 136 fills and seals the wafer structure 130 with cesium. The chamber structure 136 comprises an inner chamber 140, an outer chamber 141, a platform 142, a sealing mechanism 143, a cesium source 144, a cesium source valve 145, a gas source 146, a gas source valve 147, a pump 148, and a pump valve 149.

The outer chamber 141 encapsulates the inner chamber 140. The wafer structure 130 rests on the platform 142 within the inner chamber 140. In one example, the sealing mechanism 143 comprises a plug installation component. The sealing mechanism 143 works with the platform 142 to seal the cesium in the wafer structure 130. In one example, cesium source 144 comprises an alkali metal source and the cesium source valve 145 comprises an alkali metal source control component. The cesium source 144 attaches to the inner chamber 140 to form a channel between the inner chamber 140 and the cesium source 144. The channel between the inner chamber 140 and the cesium source 144 is controlled by the cesium source valve 145. The cesium source valve 145 controls opening and closing of the channel between the inner chamber 140 and the cesium source 144.

The gas source 146 attaches to the inner chamber 140 to form a channel between the inner chamber 140 and the gas source 146. The channel between the inner chamber 140 and the gas source 146 is controlled by the gas source valve 147. In one example, the gas source valve 147 comprises a gas source control component. The gas source valve 147 controls opening and closing of the channel between the inner chamber 140 and the gas source 146.

The pump 148 attaches to the inner chamber 140 to form a channel between the inner chamber 140 and the pump 148. The channel between the inner chamber 140 and the pump 148 is controlled by the pump valve 149. In one example, the pump valve 149 comprises a pump control component. The pump valve 149 controls opening and closing of the channel between the inner chamber 140 and the pump 148.

A description of an exemplary operation of the apparatus 100 is now presented, for explanatory purposes. Prior to filling the wafer structure 130 with cesium, the temperature in the inner chamber 140 is elevated and the pump 148 evacuates the inner chamber 140 to remove any impurities from the array of die structures analogous to the die structure 101 in the wafer structure 130. The inner chamber 140 isothermally maintains a temperature that corresponds to a desired vapor pressure. In one example, the desired vapor pressure comprises the partial pressure of cesium. Thus, the amount of cesium in the die structure 101 may be precisely determined. Control of a temperature of the inner chamber 140 and control of a temperature of the cesium source 144 serves to allow control of an equilibrium partial pressure of the inner chamber 140 and control of the amount of cesium in the die structure 101. The cesium source 144 maintains a temperature greater than the temperature of the inner chamber 140 by around one degree Celsius during filling and sealing of the wafer structure 130. The temperature gradient between the inner chamber 140 and the cesium source 144 facilitates a transport of cesium from the cesium source 144 to the inner chamber 140 when the cesium source valve 145 is open.

The gas source 146 comprises gas that is inert with respect to cesium. The gas enters the inner chamber 140 when the gas source valve 147 is open. The gas enters the cesium source 144 when the gas source valve 147 and the cesium source valve 145 are open. The gas entering the cesium source 144 facilitates a transport of cesium from the cesium source 144 to the inner chamber 140 when the cesium source valve 145 is open.

The outer chamber 141 maintains a temperature greater than the temperature of the inner chamber 140 by around ten degrees Celsius during filling and sealing of the wafer structure 130. The temperature gradient exists between the inner chamber 140 and the outer chamber 141 so that cesium will not deposit on surfaces of the chamber structure 136 that are adjacent to the outer chamber 148.

At a first time, the inner chamber 140 comprises a vapor mixture of cesium and inert gas. The inner chamber 140 comprises an equilibrium vapor pressure. The cesium of the vapor mixture fills the wafer structure 130. At a second time, the sealing mechanism 143 traverses the array of die structures analogous to the die structure 101 sealing each die structure of the array of die structures analogous to the die structure 101 to generate an array of die structures analogous to the die structure 101 containing cesium. A computer automates the platform 142 and the sealing mechanism 143 so that the sealing mechanism 143 has knowledge of the position of each die structure in the array of die structures analogous to the die structure 101.

At a third time, the cesium source valve 145 and the gas source valve 147 are closed, the pump valve 149 is opened, and the temperature in the inner chamber 140 is elevated. The pump 148 removes any excess cesium from the inner chamber 140. A cutter component separates the array of die structures analogous to the die structure 101 containing cesium which generates a plurality of individual cesium-filled die structures analogous to the die structure 101. Thus, the batch fabrication of the plurality of individual cesium-filled die structures 150 analogous to the die structure 101 on the wafer structure 130 comprises an automated process. An atomic clock comprises one exemplary employer of the individual cesium-filled die structure 150.

Figure 5:
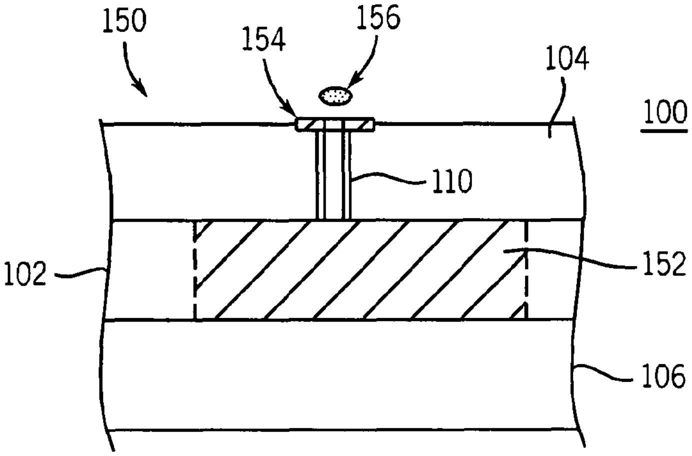
FIG. 5 a cross-section view of one exemplary implementation of a method of sealing the die structure of the apparatus of FIG. 1.

Turning to FIG. 5, a cross-section view of the individual cesium-filled die structure 150 illustrates one embodiment of a method of sealing a reservoir 152 containing cesium of the individual cesium-filled die structure 150. The method of sealing the reservoir 152 employs a ring 154 and a plug 156. In one example, the ring 154 and the plug 156 comprise a metal ring and a metal plug. For example, the ring 154 and the plug 156 comprise a metal that does not react with cesium (i.e., copper). An anodic bond attaches the ring 154 to a surface of the first outside layer 104 in a closed loop around the channel 110. A compression bond attaches the plug 156 to the ring 154 thus sealing an opening of the reservoir 152 containing cesium. The ring 154 and the plug 156 may comprise a platinum coating to prevent oxidation. The platinum coating maintains the sealed integrity of the reservoir 152 containing cesium.

Another embodiment of the method of sealing the reservoir 152 containing cesium of the individual cesium-filled die structure 150 is to compression bond a Pyrex or tungsten cover to an opening of the channel 110. The sealing mechanism 143 may apply the Pyrex or tungsten cover to the opening of the channel 110. Tungsten is inert with respect to cesium and also bonds well with borosilicate glass (i.e., Pyrex). Yet another embodiment of the method of sealing the reservoir 152 containing cesium of the individual cesium-filled die structure 150 is to anodically bond a metal disk to the opening of the channel 110.

Figure 6:
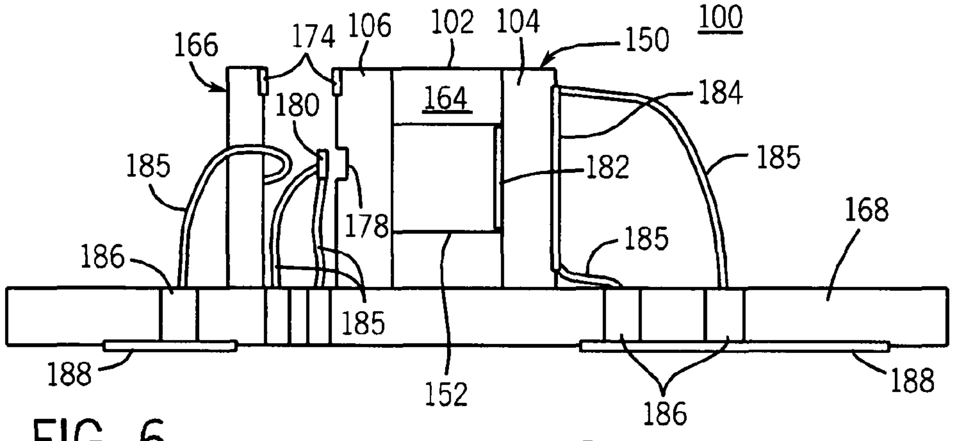
FIG. 6 is a representation of one exemplary implementation of a photocell and the die structure of the apparatus of FIG. 1 fixedly mounted to a first beam structure.
Figure 7:
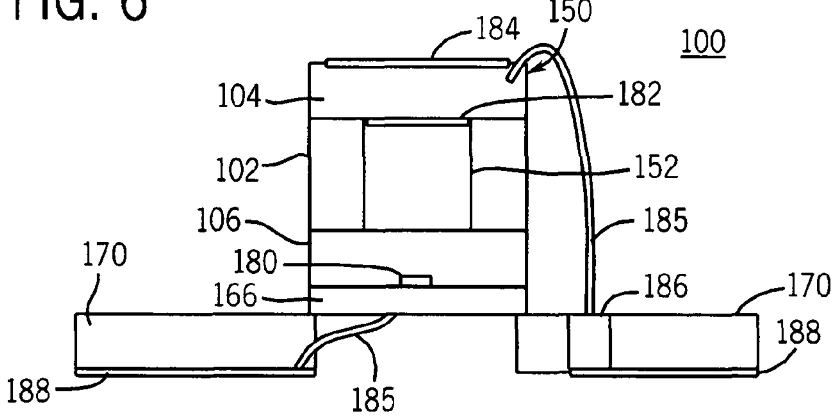
FIG. 7 is a representation of another exemplary implementation of a photocell and the die structure of the apparatus of FIG. 1 fixedly mounted to a first beam structure.

Turning to FIGS. 6-7, the individual cesium-filled die structure 150 and a photocell 166 are shown fixedly mounted in a first orientation to a first beam structure 168 in FIG. 6. The individual cesium-filled die structure 150 and the photocell 166 are shown fixedly mounted in a second orientation to a second beam structure 170 in FIG. 7. The first and second beam structures 168 and 170 comprise thermal isolators for the individual cesium-filled die structure 150. The first and second beam structures 168 and 170 comprise long beams with small cross-sectional areas. The small cross-sectional areas serve to reduce a conductive loss of heat from the reservoir 152 containing cesium. The first and second beam structures 168 and 170 also comprise a high aspect ratio. The high aspect ratio serves to increase a rigidity of the first and second beam structures 168 and 170. In one example, the first and second beam structures 168 and 170 comprise dimensions of one hundred micrometers by five hundred micrometers by seven millimeters. In one example, the first and second beam structures 168 and 170 comprise ceramic wafers that are shaped by a laser cutting tool. In another example, the first and second beam structures 168 and 170 comprise glass wafers. One of the first and second beam structures 168 and 170 may replace one of the first outside layer 104 and the second outside layer 106 in the individual cesium-filled die structure 150. In one example, the second beam structure 170 replaces the second outside layer 106 in the individual cesium-filled die structure 150. The middle layer 102 and the first outside layer 104 bond to the second beam structure 170 to form the individual cesium-filled die structure 150.

Referring to FIG. 6, the second outside layer 106 and the photocell 166 comprise one or more metal bonding pads 174. The one or more metal bonding pads 174 facilitate an connection between the second outside layer 106 and the photocell 166. The one or more metal bonding pads 174 may comprise gold for compression bonding at a temperature of approximately two hundred degrees Celsius. The second outside layer 106 comprises a recess 178. The recess 178 provides a location to accommodate a vertical cavity surface emitting laser 180 ("VCSEL"). The vertical cavity surface emitting laser 180 may comprise an attached heater. In one example, the vertical cavity surface emitting laser 180 and the recess 178 extend two hundred micrometers into the second outside layer 106. One advantage of a silicon version of the second outside layer 106 is that silicon provides an attenuation for the vertical cavity surface emitting laser 180.

The first outside layer 104 comprises a mirror 182 on a boundary between the first outside layer 104 and the reservoir 152 containing cesium. The mirror 182 comprises a dielectric material that is inert with respect to cesium. The first outside layer 104 comprises a heater 184 on an outer surface opposite the mirror 182.

Conducting wires 185 connect the photocell 166, the vertical cavity surface emitting laser 180, and the heater 184 to electrical contacts 186 on the first beam structure 168. A wire bonder connects the conducting wires 185 to the electrical contacts 186. For the configuration shown in FIG. 6, the wire bonder bonds wires on surfaces which lie in perpendicular planes to the beam structure 168. For the configuration shown in FIG. 7, the wire bonder bonds wires on surfaces which lie in parallel planes to the beam structure 170. The beam structures 168 and 170 comprise conducting traces 188. The conducting traces 188 may function both as electrical connections and mounting pads.

Figure 8:
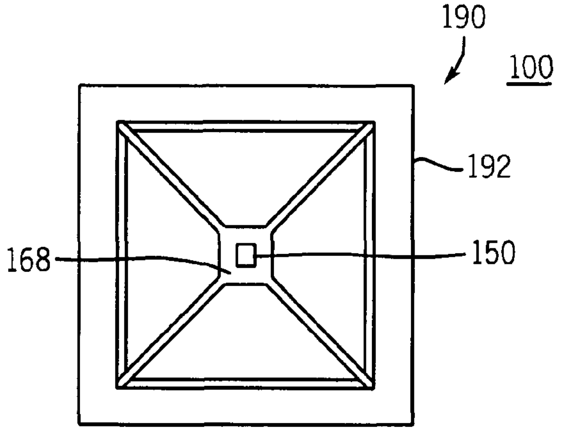
FIG. 8 is one representation of one exemplary implementation of a system package that comprises a housing for the die structure of the apparatus of FIG. 1.
Figure 9:
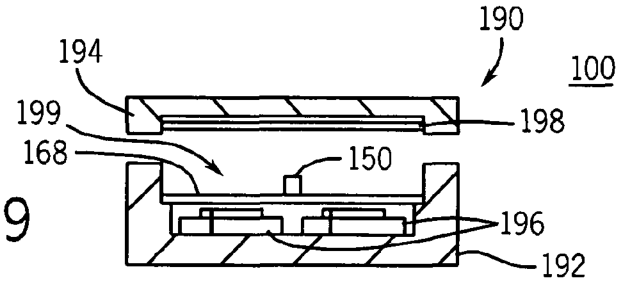
FIG. 9 is another representation of one exemplary implementation of a system package that comprises a housing for the die structure of the apparatus of FIG. 1.

Turning to FIGS. 8 and 9, a die structure package 190 comprises a housing for the individual cesium-filled die structure 150. The die structure package 190 comprises inorganic materials. Inorganic materials are free from outgassing. Inorganic materials do not release gas due to a pressure decrease or temperature increase. The die structure package 190 comprises a base 192 and a cover 194. In one example, the die structure package 190 comprises a ceramic die structure package. FIG. 8 illustrates a top view of the base 192. FIG. 9 illustrates a cross-section view of the die structure package 190. In one example, the individual cesium-filled die structure 150 and the beam structure 168 are fixedly mounted to the base 192. In another example, individual cesium-filled die structure 150 and the beam structure 170 are fixedly mounted to the base 192. The die structure package 190 comprises a first layer and a second layer. The first layer comprises cesium-filled die structure 150, the beam structure 168, and an electrical conductor. The second layer of the die structure package 190 comprises supplemental electronics 196 that provide supplementary functionality to the cesium-filled die structure 150, the beam structure 168, and the electrical conductor. The cover 194 comprises a recess to accommodate a getter 198 mounted to the cover 194.

Referring to FIGS. 6 and 8-9, a vacuum evacuates a space 199 within the die structure package 190 between the base 192 and the cover 194. The base 192 and the cover 194 are tightly bonded together defining a boundary of the vacuum which surrounds the individual cesium-filled die structure 150. Materials of the die structure package 190 are inorganic to insure vacuum integrity. The getter 198 absorbs matter that may be present in the space 199 after the base 192 and cover 194 are tightly bonded together. The beam structure 168 suspends and thermally isolates the individual cesium-filled die structure 150 within the space 199. The beam structure 168 electrically connects the individual cesium-filled die structure 150 to the electronics 196. In one example, the first beam structure 168 comprises an outer layer of a low emissivity metal (i.e., titanium, aluminum, or gold) to minimize a loss of thermal energy due to radiation. Lithography removes a portion of the metal layer to define electrically isolated portions, to create the electrical contacts 186, and to create the conducting traces 188. The electrical contacts 186 and conducting traces 188 are capable of carrying current, voltage, and power signals. Additionally, the conducting traces 188 may function as mounting pads for bonding the beam structure 168 to the base 192. Thus, the die structure package 190 in conjunction with the beam structure 168 thermally isolates, electrically connects, and suspends the individual cesium-filled die structure 150.

The individual cesium-filled die structure 150 is thermally isolated by the vacuum enclosed by the die structure package 190, the beams of the beam structure 168 comprise a metal coating, and the individual cesium-filled die structure 150 is small. Therefore, the heater 184 requires small amounts of power to maintain the individual cesium-filled die structure 150 within a temperature range of fifty to eighty degrees Celsius in an environment where the ambient temperature is cooler than fifty degrees Celsius.

The individual cesium-filled die structure 150 comprises one or more components that serve to add functionality of a die structure application to the individual cesium-filled die structure 150. The one or more components are coupled with the die structure. One example of the die structure application comprises the atomic clock. The atomic clock comprises one exemplary application that utilizes the individual cesium-filled die structure 150. The individual cesium-filled die structure 150 mounts to the beam structure 168 and the die structure package 190 covers the individual cesium-filled die structure 150. The atomic clock comprises a small cesium-based atomic clock. A geometry of the individual cesium-filled die structure 150 and the beam structure 168 may be tailored to the atomic clock to endure shock and vibration effects. The atomic clock benefits from an ability to create devices and structures on the individual cesium-filled die structure 150. The features of the atomic clock are easily integrated into the individual cesium-filled die structure 150. The atomic clock benefits from micro-electromechanical systems technology to produce a plurality of atomic clocks though batch fabrication.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:

a chamber structure that accommodates an array of die structures;

wherein the chamber structure comprises an inner chamber and an outer chamber that encapsulates the inner chamber, wherein the outer chamber comprises a temperature greater than a temperature of the inner chamber;

wherein the array of die structures are located within the inner chamber;

wherein the array of die structures comprise one or more cavities;

wherein the chamber structure comprises an alkali metal source and an alkali metal source control component, wherein the alkali metal source control component fills a portion of the inner chamber and the one or more cavities of the array of die structures with a portion of the alkali metal source as a vapor;

wherein the chamber structure comprises a plug installation component that seals the one or more cavities of the array of die structures with a metal plug that is compression bonded to a metal ring coupled with the one or more cavities.

2. The apparatus of claim 1, wherein the chamber structure comprises a gas source and a gas source control component, wherein the gas source comprises a gas that is inert to the alkali metal, wherein the gas source control component fills a portion of the chamber with a portion of the gas source.

3. The apparatus of claim 1, wherein the chamber structure comprises a pump that evacuates the inner chamber of any of the portion of the alkali metal source that is free of the one or more cavities of the array of die structures.

4. The apparatus of claim 1, wherein the temperature of the outer chamber is greater than the temperature of the inner chamber by approximately ten degrees Celsius.

5. The apparatus of claim 1, wherein the outer chamber encapsulates the inner chamber, wherein the temperature of the outer chamber is greater than the temperature of the inner chamber to promote a decrease in an amount of the portion of the alkali metal source that deposits on a surface of the inner chamber adjacent to the outer chamber.

6. The apparatus of claim 1, wherein the alkali metal source comprises a temperature greater than a temperature of the inner chamber, wherein the temperature of the alkali metal source is greater than the temperature of the inner chamber to promote a transport of the portion of the alkali metal source as the vapor to the inner chamber.

7. The apparatus of claim 1, wherein control of a temperature of the inner chamber and control of a temperature of the alkali metal source serves to allow control of an equilibrium partial pressure of the portion of the portion of the alkali metal source within the chamber and control of an amount of the portion of the alkali metal source that deposits within the one or more cavities of the array of die structures.

8. The apparatus of claim 1, wherein the array of die structures are formed from a middle layer, a first outside layer, and a second outside layer;

wherein the middle layer comprises the one or more cavities that are filled with the vapor of the alkali metal source;

wherein one of the first outside layer and the second outside layer comprises one or more channels that lead to the one or more cavities;

wherein the one or more cavities are filled with the vapor of the alkali metal source through the one or more channels.

9. The apparatus of claim 1, wherein the chamber is configured to maintain a temperature that corresponds to a desired vapor pressure;

wherein the desired vapor pressure is equal to the partial pressure of cesium.

10. The apparatus of claim 1, wherein the plug installation component is located within the inner chamber.

* * * * *

UNITED STATES PATENT AND TRADEMARK OFFICE

CERTIFICATE OF CORRECTION

PATENT NO. : 7,973,611 B2
APPLICATION NO. : 11/900244
DATED : July 5, 2011
INVENTOR(S) : Abbink et al.

It is certified that error appears in the above-identified patent and that said Letters Patent is hereby corrected as shown below:

In the Specification

Col. 1, Line 4, after the title, please insert the following title and paragraph:

--CROSS-REFERENCE TO RELATED APPLICATION

This application is a Divisional of application number 10/831,812, filed April 26, 2004.--

Signed and Sealed this
Twenty-fourth Day of June, 2014

Michelle K. Lee
*Deputy Director of the United States Patent and Trademark Office*